United States Patent [19]

Ray

[11] Patent Number: 5,028,888

[45] Date of Patent: Jul. 2, 1991

[54] MULTISTAGE CURRENT-CONTROLLED OSCILLATOR

[75] Inventor: Daniel L. Ray, Fair Oaks, Calif.

[73] Assignee: Level One Communication, Inc., Folsom, Calif.

[21] Appl. No.: 436,848

[22] Filed: Nov. 15, 1989

[51] Int. Cl.[5] .............................................. H03B 1/00
[52] U.S. Cl. ..................................... 331/57; 307/239; 307/246
[58] Field of Search .............. 307/228, 239, 246, 260, 307/266, 267, 268; 328/55, 58; 331/57

[56] References Cited

U.S. PATENT DOCUMENTS

| 4,091,335 | 5/1978 | Giolma et al. | 331/57 X |
| 4,584,695 | 4/1986 | Wong et al. | 331/57 X |
| 4,736,118 | 4/1988 | Fischer | 307/228 X |

Primary Examiner—Robert J. Pascal
Attorney, Agent, or Firm—Skjerven, Morrill, MacPherson, Franklin & Friel

[57] ABSTRACT

A current-controlled oscillator includes a plurality of switches for generating a time delay signal, each switch including an MOS transistor operatively coupled to the next gate by means including a capacitor, the final MOS transistor being connected to the initial MOS transistor by a feedback conductor also operatively connected with a capacitor. The frequency of the oscillator is varied by varying current injected into the oscillator.

7 Claims, 2 Drawing Sheets

MULTISTAGE CURRENT-CONTROLLED OSCILLATOR

BACKGROUND OF THE INVENTION

1. Field of the Invention

This invention relates to a current-controlled oscillator and its use in a phase locked loop system.

2. Description of the Prior Art

Basically a phase locked loop is a frequency feedback system comprised of a phase detector, a low-pass filter and a variable oscillator in the feedback path. When the input signal of the loop is zero the oscillator operates at a predetermined, free-running frequency. If an input signal is applied, the phase detector compares the phase and frequency of the input signal with the signal of the variable oscillator and generates an error voltage that is related to the difference in the two signals. The error voltage is then filtered and applied to the control of the oscillator thereby varying the variable oscillator frequency in a direction that reduces the difference between the two systems. When the frequencies of the two signals become sufficiently close, the feedback nature of the system causes the system to lock with the incoming signal. Once in lock the variable oscillator frequency is identical with the input signal, except for a finite phase difference which is necessary to generate the corrective error voltage to shift the variable oscillator frequency to the input signal frequency, thus keeping the system interlocked.

Data transmitting over a single channel coupled with a pair of transceivers, each of which sends and recieves data, requires that the receiving unit extract not only encoded data but also a timing reference in order to accurately decode the transmitted data. In such a system, it is desirable for one of the transceivers to synchronize its operations to the system providing the data to be transmitted, the other transceiver must then synchronize its operation to the data received from the first transceiver. A basic element required to perform each of the two synchronizing operations is a high-speed oscillator where output frequency can be adjusted by a controlling input.

Normally, a phase locked loop system has a voltage controlled oscillator which runs off the low pass filter output. However, to integrate a voltage controlled oscillator in general requires considerable silicon area on the chip due to the complexity of the circuit. A further problem found in using voltage controlled oscillators is in getting the phase lock loop system to lock on the input signal, i.e., to generate the proper error voltage to regulate the voltage controlled oscillator signal output.

Of general interest in this area is U.S. Pat. No. 4,091,335, which discloses a phase locked loop using a current-controlled ring oscillator. While such a system is effective for the purpose designed, it is to be noted that such system is implemented in bipolar technology, and may lack the flexibility and response needed in certain applications. The current circuit invention is directed to aiding response of the frequency output signal to the current input signal, and includes structure for ensuring that this is achieved, with the circuit being implementable in CMOS technology, to provide all the advantages attendant thereto, including low power draw and high packing density.

Of further interest in this area is U.S. Pat. No. 4,584,695, disclosing as a portion thereof a driver clock generator. However, that circuit portion, involving capacitors, resistors, inverters and amplifiers, does not provide any structure wherein more current may be sinked by current sink means than is sourced by current source means, which would aid response of the frequency output signal to the current input signal.

SUMMARY

It is the intention of the present invention to vary the frequency of a variable oscillator by varying the current injected into the system. Such a system uses less area on the silicon chip than a voltage controlled oscillator and to a high degree of efficiency.

In accordance with the present invention, a current controlled oscillator stage includes current source means, current sink means, capacitor means connected to the current source means, and switch means connecting the current source means and current sink means, wherein the current sink means sink substantially more current than the current supplied by the current source means.

BRIEF DESCRIPTION OF THE DRAWINGS

Other objects of the invention will become apparent from the following specification and drawing in which.

DETAILED DESCRIPTION

Figure 1:
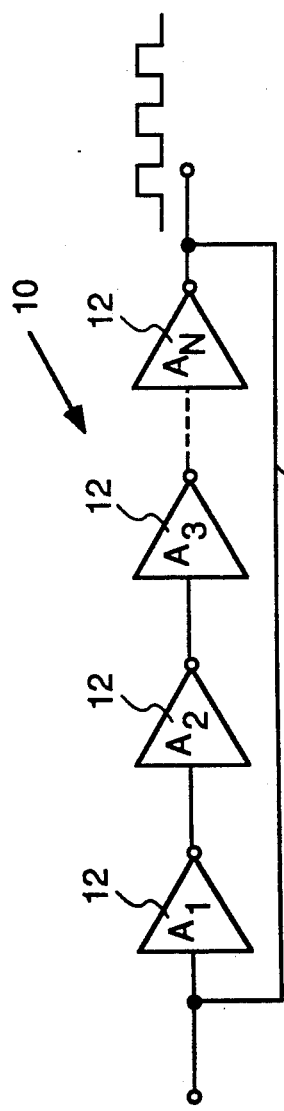
FIG. 1 is a schematic diagram illustrating a standard form of oscillator circuit.

Referring now to FIG. 1, there is shown a standard oscillator circuit 10 in the form of a plurality of inverters 12, odd in number, connected in series, with the output lead of the final inverter connected to the input lead of the initial inverter by a feedback conductor 14. Each of these inverters 12 of course changes the value of the signal received from high to low or vice versa.

Each inverter 12 has a propagation delay, which can be defined as the time it takes for the inverter 12 to perform, that being to invert the received signal. In each inverter 12, the propagation delay has two possible values, depending on whether the gate is changing from high to low or low to high.

Letting $A_n$ equal the number of gates, where $A_n$ is a positive odd integer, and T equal the propagation delay, which as an approximation can be the average value of the high and low propagation delays for each inverter 12, the frequency of the signal generated by a system as shown in FIG. 1 can be designated by the formula $$\text{Frequency} = \frac{1}{2T(A_n)}$$

Therefore it can be seen that increasing the number of gates will cause more delay and lower the frequency of the system.

As an example of operation, assume that output signal of the final inverter is low. The feedback conductor 14 provides this low output to the input lead of the initial inverter, which signal is inverted each time it goes through a succeeding inverter, with the delay described above. Because of the odd number of inverters, the output signal from the final inverter now will change to high, which high signal is fed back to the input lead of the initial inverter, which signal will be inverted with delay through each inverter until the output signal from the final inverter goes low, and so forth. Thus, the oscillator circuit 10 of FIG. 1 provides an output signal as shown adjacent the output lead thereof.

Figure 2:
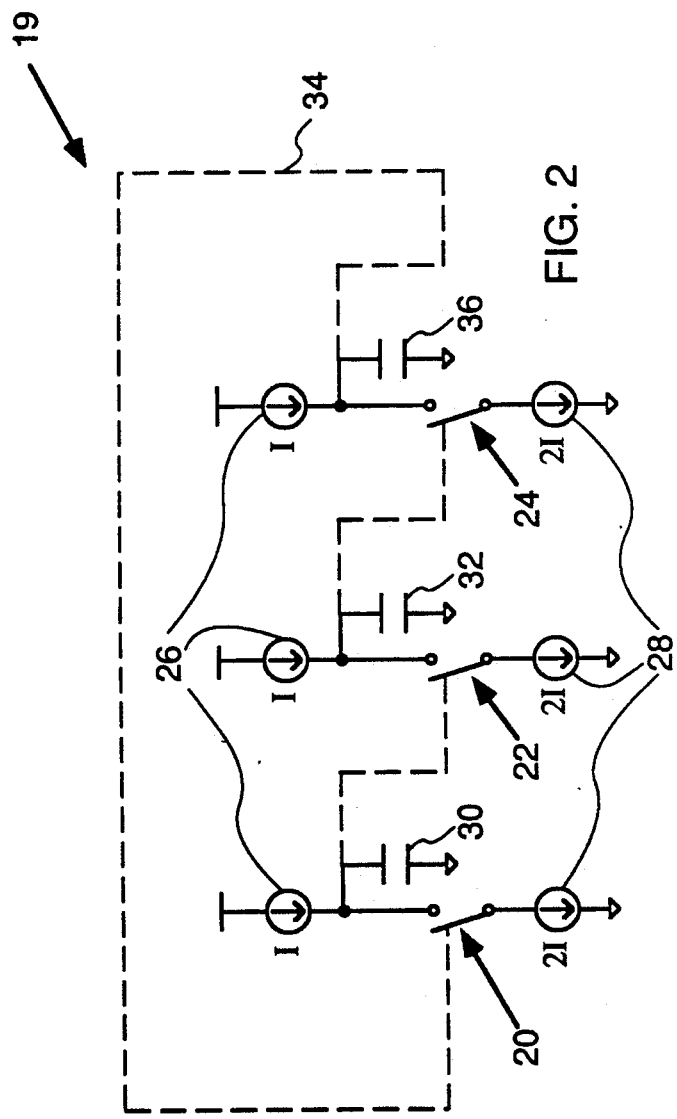
FIG. 2 is a functional diagram illustrating in general the circuit in accordance with the present invention.
Figure 3:
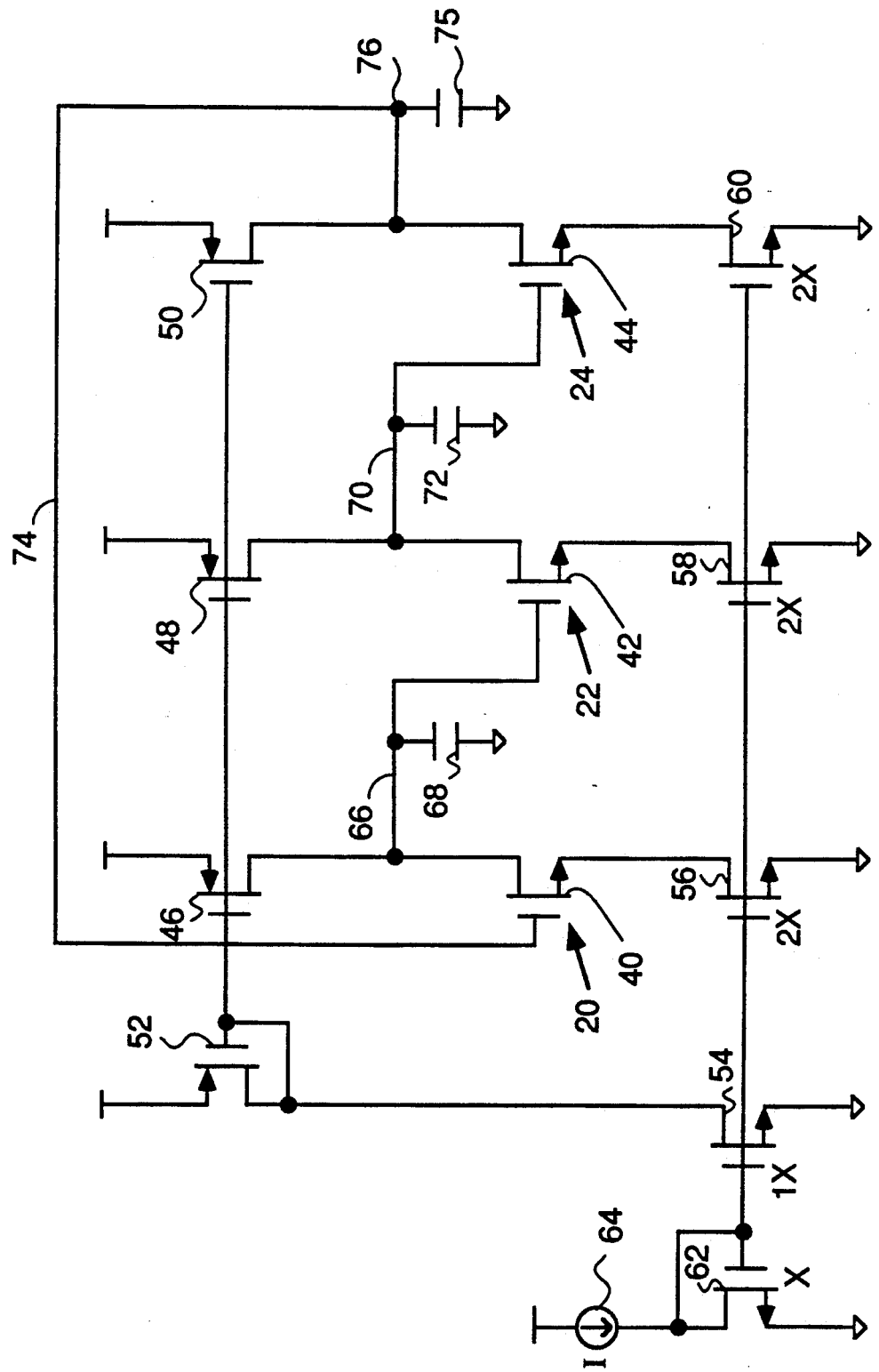
FIG. 3 is a detailed schematic diagram of the circuit embodied in the present invention.

Referring to FIGS. 2 and 3, the present invention is shown therein.

As generally shown in FIG. 2, the present circuit 19 includes an initial switch means 20, intermediate switch means 22, and a final switch means 24. The intermediate switch means 22 may include more than one switch means, but, similar to the description above, the total number of switches must be odd in number.

One side of each switch means 20, 22, 24 is connected to a current source 26, while the other side of each switch means 20, 22, 24 is connected to a current sink 28, which sinks twice the amount of the current being sourced. The current source side (26) of the switch means 20 is operatively connected with the succeeding switch means 22, and has a capacitor 30 associated therewith. Likewise, the current source side (26) of the switch means 22 is operatively connected with the switch means 24, also having a capacitor 32 operatively associated therewith. A feedback conductor 34 connects the current source side (26) of the switch means 24 with the switch means 20, and that conductor 34 also has a capacitor 36 associated therewith.

Referring to the detailed drawing of FIG. 3, the first, second and third switch means 20, 22, 24 take the form of first, second and third N-channel MOS transistors 40, 42, 44. First, second and third P-channel MOS transistors 46, 48, 50 are also included, each source thereof being connected to the power supply, with transistors 46, 48, 50 each having a drain thereof connected to a respective drain of an N-channel MOS transistor 40, 42, 44. These devices act as current sources. The gates of the transistors 46, 48, 50 are connected in common to the gate of a P-channel current source transistor 52 having its gate tied to its drain. Other N-channel MOS transistors 56, 58, 60 are included, each having a drain connected to a respective source of a transistor 40, 42, 44, respectively. A bias set transistor 62 is included, having its gate tied to its source, and connected to a controlling current source 64. An N-channel MOS transistor 54 has its drain tied to the drain of transistor 52. The gates of the transistors 54, 56, 58, 60, 62 are connected in common, and the sources of the transistors 54, 56, 58, 60, 62 are connected to ground.

A conductor 66 connects the drain of the transistor 40 with the gate of the transistor 42. A capacitor 68 has one terminal connected to the conductor 66 and the other terminal connected to ground. Similarly, a conductor 70 connects the drain of the transistor 42 with the gate of the transistor 44, with a capacitor 72 having one terminal connected to the conductor 70 and the other terminal connected to ground. A feedback conductor 74 connects the drain of the transistor 44 with the gate of the transistor 40, and similarly has a capacitor 75 having one terminal connected to the feedback conductor 74 and the other terminal connected to ground.

Assuming a certain level of current source provided by current source 64 to transistors 46, 48, 50, and assuming as an initial state that output at node 76 is low, that low node output will drive gate of transistor 40 low through the feedback conductor 74. With transistor 40 thus turned off, current will be provided to the gate of transistor 42, charging capacitor 68 and turning transistor 42 on. With transistor 42 on, charge will be allowed to flow from the gate of transistor 44 through transistor 42 and also from capacitor 72, assuming it was previously charged.

Transistor 58 sinks twice as much current as that sourced to transistor 42, so that proper current sinking takes place to allow capacitor 72 and the gate of transistor 44 to discharge through transistor 58. (Similarly, transistor 56 sinks twice as much current as that sourced to transistor 40, and transistor 60 sinks twice as much current as that sourced to transistor 44).

With transistor 44 off, node 76 goes high, providing that gate of transistor 40 goes high through feedback conductor 74, and capacitor 75 charges, and so forth. The frequency of the oscillation is determined by the charging speed of each stage. By providing more input current, each appropriate capacitor 68, 72, 75 associated with a stage is more rapidly charged, allowing more rapid charging of the gates of the transistors which are going high. Correspondingly, with more input current, for those transistors going low, the gates thereof, along with the charged capacitors, go low more rapidly because the sink transistors sink twice as much current as is sourced.

Thus, it will be seen that the present oscillator is controlled by current level in a highly effective manner, achieving direct variation in oscillation frequency with variation in input current.

It should also be noted that the output waveform of this oscillator will have equal rise and fall times, due to the accurate current control of the sink and source currents. This enables the invention to be used in a wide variety of applications as the output waveform can be readily converted to a square wave with close to a 50% duty cycle, whereas an inverter chain has no such control of both sink and source currents, and therefore less control of output rise and/or fall times.

It will be noted that the present invention is implemented in CMOS (and can be implemented on a die with other logic circuitry), requiring very low power, since the pair of transistors 52, 54, the pair of transistors 46, 40, the pair of transistors 48, 42, and the pair transistors 50, 44 are respectively connected in complementary MOS technology.

The present oscillator provides a means of accurately setting center frequency and for properly and conveniently adjusting the output frequency. The multiple stages provide reduced noise sensitivity by increasing the slew rate at the oscillator output terminals. Multiple phase outputs are also available for implementing a high-resolution digital phase locked loop. The out-of-phase nature of the individual outputs of the stages can be alternately selected to provide a delaying function. An output clock can be derived by switching among the three individual stage output signals.

By referencing a stage delay to a capacitance and current, the output frequency of the apparatus can be specified to a range that is much narrower than if a simple inverter is used as the delay element. A reference current which would scale with capacitance could be used to set the oscillator output close to its final value, thus minimizing the required pull-range of the phase-lock loop filter.

The use of current as the frequency controlling element allows a continuously variable output frequency.

Although the present invention has been described with reference to a preferred embodiment, those skilled in the art will recognize that modifications may be made thereto without departing from the spirit and scope of the invention, which is defined by the following claims.

What is claimed is:

1. A current-controlled oscillator stage comprising:
   current source means;
   current sink means;
   capacitor means connected with the current source means;
   switch means switchably connecting the current source means and the capacitor means to the current sink means;
   wherein the current sink means substantially more current than the current supplied by the current source means.

2. The apparatus of claim 1 wherein the current sink means sinks substantially twice the current supplied by the current source means.

3. The apparatus of claim 2 wherein the capacitor has one terminal connected to the current source means and the other terminal connected to a voltage reference terminal.

4. The apparatus of claim 3 wherein the connection of the capacitor to the current source means provides an output signal.

5. The apparatus of claim 4 wherein the switch means comprise an N channel MOS transistor, having a first source/drain region connected to the current source means and a second source/drain region connected to the current sink means.

6. The apparatus of claim 5 wherein the current source means comprise a P channel MOS transistor with a first source/drain region connected to the capacitor means, and a second source/drain region connected to a voltage supply terminal, and the gate connected to a current source voltage reference.

7. The apparatus of claim 6 wherein the current sink means comprise an N channel MOS transistor with a first source/drain region connected to the second source/drain region of the first switch means, a second source/drain region connected to a voltage supply terminal, and a gate connected to a current sink voltage reference.

* * * * *